US007768837B2

(12) United States Patent
Choi et al.

(10) Patent No.: US 7,768,837 B2
(45) Date of Patent: Aug. 3, 2010

(54) FLASH MEMORY DEVICE WITH WRITE DRIVER AND BIT LINE DETECTING DRIVING CIRCUITS

(75) Inventors: Jong-In Choi, Gwangjin-gu (KR); Dong-Woo Lee, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 11/871,371

(22) Filed: Oct. 12, 2007

(65) Prior Publication Data

US 2008/0123431 A1 May 29, 2008

(30) Foreign Application Priority Data

Nov. 23, 2006 (KR) ........................ 10-2006-0116484

(51) Int. Cl.
*G11C 16/06* (2006.01)
(52) U.S. Cl. ........................ 365/185.23; 365/185.28
(58) Field of Classification Search ............ 365/185.23, 365/185.28
See application file for complete search history.

(56) References Cited

U.S. PATENT DOCUMENTS

| 5,576,990 | A | * | 11/1996 | Camerlenghi et al. ... | 365/185.23 |
|---|---|---|---|---|---|
| 5,905,677 | A | * | 5/1999 | Casagrande et al. .... | 365/185.23 |
| 6,005,802 | A | * | 12/1999 | Takeuchi et al. ....... | 365/185.02 |
| 6,172,917 | B1 | | 1/2001 | Kataoka et al. | |
| 6,195,301 | B1 | * | 2/2001 | Huffman et al. ......... | 365/202 |
| 6,574,148 | B2 | * | 6/2003 | Chevallier .............. | 365/185.23 |
| 6,597,609 | B2 | * | 7/2003 | Chevallier .............. | 365/201 |
| 6,819,600 | B2 | | 11/2004 | Sim | |
| 6,999,359 | B2 | | 2/2006 | Kim et al. | |
| 7,009,882 | B2 | * | 3/2006 | Chen ..................... | 365/185.18 |
| 7,286,413 | B2 | | 10/2007 | Jeong et al. | |
| 7,457,165 | B2 | | 11/2008 | Jeong et al. | |
| 2006/0291285 | A1 | * | 12/2006 | Mokhlesi et al. ....... | 365/185.18 |

FOREIGN PATENT DOCUMENTS

| JP | 11328981 | 11/1999 |
|---|---|---|
| JP | 1020000027300 A | 5/2000 |
| JP | 2006127738 | 5/2006 |
| KR | 1020010018711 A | 3/2001 |
| KR | 1020020055919 A | 7/2002 |
| KR | 1020040003210 A | 1/2004 |
| KR | 1020050091235 A | 9/2005 |
| KR | 1020060035130 A | 4/2006 |

* cited by examiner

*Primary Examiner*—Tuan T Nguyen
*Assistant Examiner*—R Lance Reidlinger
(74) *Attorney, Agent, or Firm*—Volentine & Whitt, P.L.L.C.

(57) ABSTRACT

A flash memory device and a method of programming a flash memory device include selecting bit lines connected to program cells of multiple memory cells coupled to a selected word line. The selected bit lines are driven to a bit line program voltage through a write driver circuit connected to first ends of the selected bit lines. The selected bit lines are also driven to the bit line program voltage through a bit line detecting/driving circuit connected to second ends of the selected bit lines. The bit line detecting/driving circuit activates the selected bit lines synchronously with voltage variations of the selected bit lines.

4 Claims, 7 Drawing Sheets

Fig. 3

(PRIOR ART)

|  | Erase | Program | Read |
|---|---|---|---|
| Sel. W/L | −10V | 10V | 4V~5V |
| Unsel/ W/L | F | 0 | 0 |
| "0" B/L | F | 5V | <1.2V |
| "1" B/L | F | 0 | 1.2V |
| S/L | F | 0 | 0 |
| Bulk | 6V~8V | 0 | 0 |

(F:Floating)

FLASH MEMORY DEVICE WITH WRITE DRIVER AND BIT LINE DETECTING DRIVING CIRCUITS

CROSS-REFERENCE TO RELATED APPLICATIONS

A claim of priority is made to Korean Patent Application No. 10-2006-0116484, filed on Nov. 23, 2006, the subject matter of which is hereby incorporated by reference.

BACKGROUND

1. Field of the Invention

The present invention disclosed herein relates to semiconductor memories, and more particularly, to a flash memory device and a method of programming the flash memory device.

2. Description of the Related Art

Semiconductor memory devices are classified into volatile and nonvolatile types. Generally, volatile semiconductor memory devices store and read data only when power is supplied, and lose their data when no power is supplied. In comparison, nonvolatile semiconductor memory devices, such as a mask read only memory (MROM), a programmable ROM (PROM), an erasable and programmable ROM (EPROM), an electrically erasable and programmable ROM (EEPROM), and the like, are able to retain stored data even without power.

Data storage conditions of the nonvolatile memories are permanent or re-programmable in accordance with the technologies for manufacturing them. For example, MROM, PROM and EPROM devices generally are not flexible in independently erasing and writing data through systemic operations and are inconvenient for typical users to renew or update storage contents. EEPROM devices, though, are more convenient for electrically erasing and writing data, so these devices are increasingly used in auxiliary storage units and system programming fields requiring continuous data updates. Flash EEPROMs (referred to as "flash memories") are particularly useful as large-capacity, auxiliary storage units because they offer higher integration density than conventional EEPROMs. In recent years, the use of flash memories as large-capacity storage units or coded memories has increased, especially in response to requirements for large storage capacity or high speed.

Flash memories are generally categorized as NOR or NAND type flash memories, in accordance with interconnections between cells and bit lines. In a NOR-flash memory, one bit line is connected to two or more cell transistors in parallel, such that data are stored in a channel hot-electron mode and erased in a Fowler-Nordheim (F-N) tunneling mode. In a NAND-flash memory, one bit line is connected to two or more cell transistors in series, such that data are stored and erased in the F-N tunneling mode. In general, the NOR-flash memories are less desirable for high-density integration due to large current consumption, but more desirable for high-frequency operations.

FIG. 1 is a sectional diagram showing a typical flash memory cell, and FIG. 2 is a diagram showing threshold-voltage distribution profiles of typical flash memory cells.

Referring to FIG. 1, the flash memory cell 10 includes a P-type substrate 11, an N-type source region 12, an N-type drain region 13, a floating gate 14, and a control gate 15. Between the source region 12 and the drain region 13 is defined a channel region 16. The floating gate 14 is formed over the channel region 16, and is isolated by an insulation film 17 from the substrate 11. The control gate 15 is formed over the floating gate 14 through another insulation film 18.

As is well known, the memory cell of the NOR-flash memory device is connected between a bit line and a source line. The memory cells coupled to a word line share the source line. The memory cell, the characteristics of which are shown in FIG. 2, is detected as an on-cell or off-cell in accordance with a word-line voltage $V_{WL}$. On-cell means that the memory cell is turned on because the word-line voltage is higher than a threshold voltage of the memory cell, in which a current (i.e., the on-cell current) larger than a predetermined amount flows through the on-cell. Off-cell means that the memory cell is turned off because the word-line voltage is lower than a threshold voltage of the memory cell, in which a current smaller than a predetermined amount flows through the off-cell. Programming, erasing, and reading operations of the memory cell are as follows.

The programming operation of the memory cell 10 is accomplished by injecting hot electrons into the floating gate 14 from the channel region 16 around the drain region 13. Typically, the hot electron injection is performed under the condition that the source region 12 and the substrate 11 are grounded. A high voltage Vg (e.g., +10V) is applied to the control gate 15 and an appropriate positive voltage (e.g., 5~6V) is applied to the drain region 13 as Vd to generate the hot electrons. Under the bias condition, negative charges are sufficiently accumulated in the floating gate 14. The negative potential of the floating gate 14 contributes to raising a threshold voltage of the memory cell 10 during the reading operation.

The reading operation of the memory cell 10 is accomplished by applying an appropriate positive voltage (e.g., 1V) to the drain region 13 as Vd, a predetermined voltage (e.g., +4.5V) to the control gate 15 as Vg, and 0V to the source region 12 as Vs. During the reading operation, the memory cell 10 has an increased threshold voltage by the programming operation, and a current is interrupted to flow toward the source region 12 from the drain region 13, which is referred to as an off-state. Threshold voltages of the programmed memory cells are usually distributed between approximately 7~8.5V.

The erasing operation of the memory cell 10 is accomplished by inducing the Fowler-Nordheim (F-N) tunneling effect in the substrate 11 from the floating gate 14. The F-N tunneling effect is caused by applying a negative high voltage (e.g., -10V) to the control gate 15 as Vg and an appropriate positive voltage to the substrate 11 as Vb. Under the bias condition, negative charges are discharged into the substrate 11 (i.e., bulk region) from the floating gate 14, decreasing threshold voltages of the memory cells. If, during the reading operation, a predetermined voltage is applied to the control gate 15 of the memory cell 10 having the lowered threshold voltage by the erasing operation, a current path is formed from the drain region 13 toward the source region 12. The memory cell 10 in this condition is in an on-state. Threshold voltages of the erased memory cells are distributed in the range of approximately 1~3V, as shown in FIG. 2.

The bias conditions of the erasing, programming and reading operations are summarized in FIG. 3. Erasing or programming the memory cell is performed by a command provided externally from the flash memory device (e.g., from a memory controller or host). After the programming operation, the memory cell verifies whether a threshold voltage of the programmed memory cell is practically included in a target range of threshold voltages. When the threshold voltage of the programmed memory cell is out of the target range of threshold voltages, a re-erasing or over-erasure repairing operation is carried out so that the threshold voltage of the programmed memory cell is appropriately included in the target range of threshold voltages.

FIG. 4 is a block diagram showing a schematic structure of a typical NOR-flash memory device. In particular, the configuration shown in FIG. 4 is a functional structure of a typical NOR-flash memory device.

Referring to FIG. 4, the typical NOR-flash memory device includes a memory cell array 110, a column decoder 120, a row decoder 130, and a write driver (WD) 140. The memory cell array 110 includes memory cells arranged at intersections of word lines WL0~WLm−1 and bit lines BL0~BLn−1. The row decoder 130 selects one of the word lines in response to a row address X_ADD and drives the selected word line with a word line voltage provided by a voltage generator (not shown). The column decoder 120 selects bit lines in response to a column address Y_ADD. The write driver 140 activates the selected bit lines, driving them to a bit line program voltage or a bit line program-inhibition voltage. For instance, when program data are input to the flash memory, the write driver 140 operates to drive the selected bit lines to the bit line program voltage (e.g., 5V). Otherwise, when program-inhibition data are input to the flash memory, the write driver 140 operates to drive the selected bit lines to the bit line program-inhibition voltage (e.g., the ground voltage).

With an increase of integration density in the flash memory devices, the number of memory cells connected to a bit line may increase, which increases bit line resistance. Along with the increase of bit line resistance, a bit line voltage (i.e., the bit line program voltage) supplied by the write driver 140 during the programming operation may be less than the required voltage, especially for memory cells farthest from the write driver 140. For example, while programming memory cells coupled to the word line WLm−1, the bit line voltage may be reduced by IR, where I is current supplied from the write driver 140 and R is bit line resistance. In the programming operation, as the voltage applied to the bit line is lowered, the memory cell is supplied with an insufficient voltage (i.e., insufficient bit line voltage). In other words, the drain may be charged with a voltage Of $V_{BL}$-IR instead of the required bit line voltage $V_{BL}$. This may cause the memory cell to be insufficiently programmed.

SUMMARY OF THE INVENTION

An aspect of the present invention provides a programming method of a flash memory. The programming method includes selecting bit lines connected to program cells of multiple memory cells coupled to a selected word line; driving the selected bit lines to a bit line program voltage through a write driver connected to first ends of the selected bit lines; and driving the selected bit lines to the bit line program voltage through a bit line detecting/driving circuit connected to second ends of the selected bit lines. The bit line detecting/driving circuit activates the selected bit lines synchronously with voltage variations of the selected bit lines.

The programming method may further include applying a program voltage to the selected word line coupled to the program cells. The program voltage applied to the selected word line may be approximately 9~11V and the bit line program voltage may be approximately 4~6V, for example.

The programming method may further include discharging the bit lines before selecting the bit lines. Also, the selected bit lines may be electrically connected between the write driver and the bit line detecting/driving circuit. An output of the bit line detecting/driving circuit may be maintained at a ground voltage after a programming operation. The flash memory may be a NOR-flash memory.

Another aspect of the present invention provides a flash memory device including a memory cell array, a column decoder, a write driver circuit and a bit line detecting/driving circuit. The memory cell array includes memory cells configured to connect to multiple word lines and multiple bit lines. The column decoder selects at least one bit line of the multiple bit lines connected to at least one memory cell coupled to a selected word line in response to column selection information. The write driver circuit includes multiple write drivers, at least one write driver being connected to a first end of the at least one selected bit line. The bit line detecting/driving circuit includes multiple bit line detector/drivers, at least one bit line detector/driver being connected to a second end of the at least one selected bit line in accordance with the column selection information during a programming operation. The at least one bit line detector/driver detects voltage variations of the corresponding at least one selected bit line and drives the at least one selected bit line in accordance with a result of the detection.

The write driver circuit and the bit line detecting/driving circuit may be connectable to two or more bit lines. Also, the at least one write driver may apply a bit line voltage to the at least one selected bit line in response to an enabling signal, which may be activated after activation of the column selection information. The flash memory device may include a NOR-flash memory.

Another aspect of the present invention provides a flash memory device, including a memory cell array, a column decoder, a write driver circuit and a bit line detecting/driving circuit. The memory cell array includes multiple memory cells arranged in a matrix, which includes multiple word lines and multiple bit lines. The column decoder selects at least one bit line of the multiple bit lines in response to a column address. The write driver circuit drives the selected bit line to a bit line voltage in accordance with input data in response to an enable signal. The bit line detecting/driving circuit drives the selected bit line to the bit line voltage synchronously with voltage variations of the selected bit line, in response to a decoding result of the column address during a programming operation.

The write driver circuit may be connected to a first end of the selected bit line. The bit line detecting/driving circuit may be connected to a second end of the selected bit line.

The bit line detecting/driving circuit may include a switch circuit and bit line detector/driver units. The switch circuit may connect the selected bit line in response to the decoding result of the column address. A bit line detector/driver unit may connect to the selected bit line through the switch circuit. The bit line detecting/driving unit may detect voltages from the selected bit line and drive the selected bit line to the bit line voltage in accordance with the detected voltages.

The bit line detector/driver units may be configured to output low-level voltages at the end of the programming operation. Also, each of the bit line detecting/driving units may include a PMOS transistor, an NMOS transistor and a detector. The PMOS transistor is connected between the bit line voltage and an output terminal. The NMOS transistor is connected between the output terminal and a ground voltage, and is controlled by a control signal from a controller. The detector is configured to detect voltage variation of the output terminal and to control the PMOS transistor in response to the voltage variation detection. The detector may include an inverter.

The control signal may be complementary to the decoding result of the column address. Also, the decoding result of the column address may be activated before activation of the enable signal.

Yet another aspect of the present invention provides a flash memory device including a memory cell array that has memory cells arranged in a matrix including multiple word lines and multiple bit lines. A first column gate selects at least one bit line of the multiple bit lines in response to column selection information, and a first write driver drives the at least one selected bit line to a bit line voltage in accordance with input data in response to an enable signal. A second column gate selects the at least one bit line in response to the column selection information, and a second write driver drives the at least one selected bit line to the bit line voltage in accordance with the input data in response to the enable signal. The first write driver is connectable to a first end of the at least one selected bit line through the first column gate and the second write driver is connectable to a second end of the at least one selected bit line through the second column gate.

BRIEF DESCRIPTION OF THE DRAWINGS

The embodiments of the present invention will be described with reference to the attached drawings, in which like reference numerals refer to like parts unless otherwise specified, and in which:

FIG. 3 is a table illustrating bias conditions of erasing, programming and reading operations in a NOR-flash memory device;

DETAILED DESCRIPTION OF THE EMBODIMENTS

Figure 1:
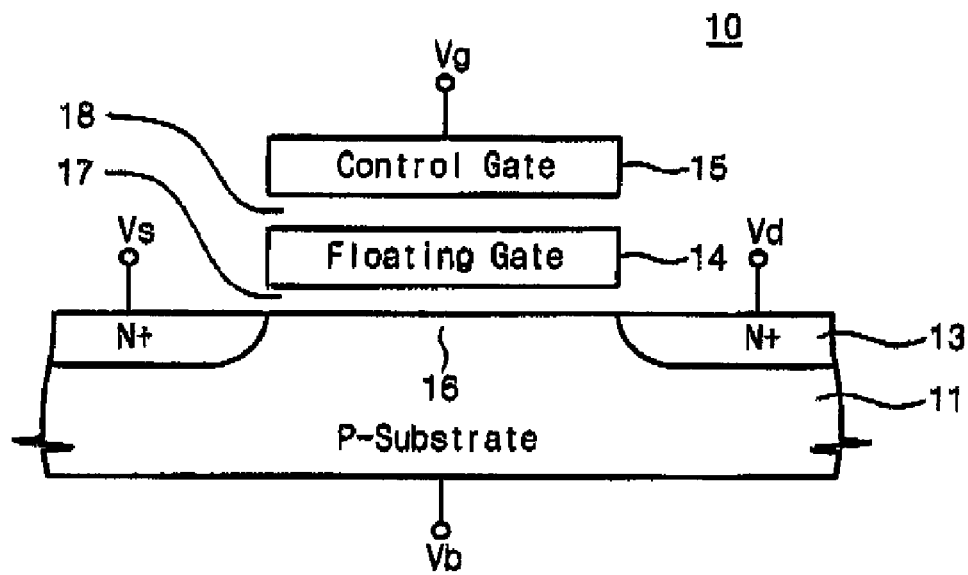
FIG. 1 is a sectional diagram illustrating a flash memory cell.
Figure 2:
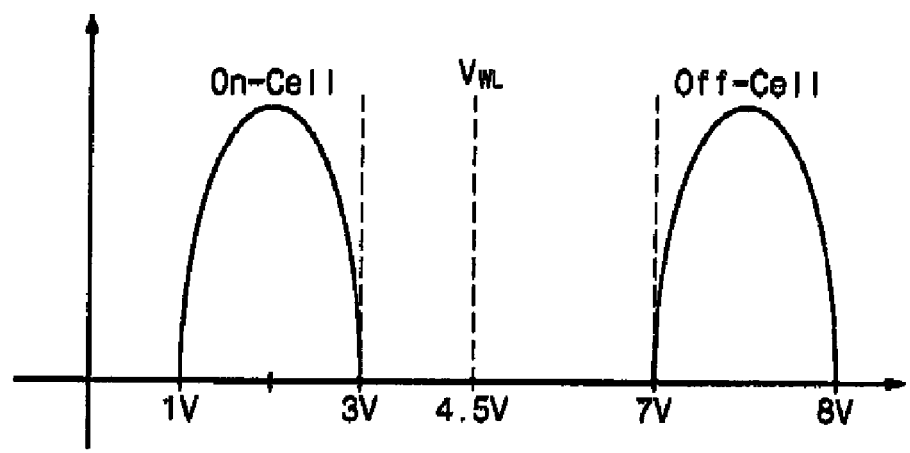
FIG. 2 is a diagram illustrating exemplary threshold-voltage distribution profiles of a flash memory cell.
Figure 4:
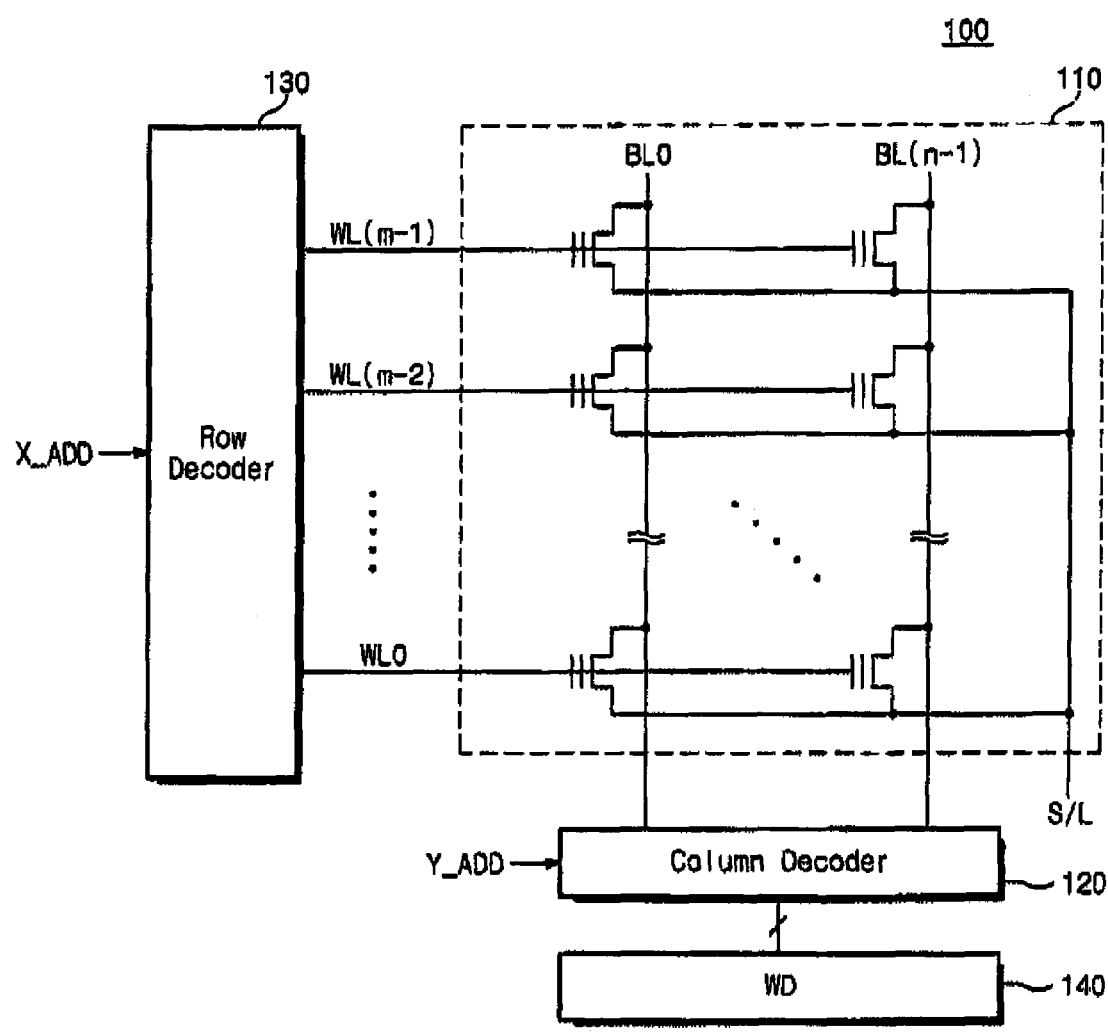
FIG. 4 is a block diagram illustrating a schematic structure of a NOR-flash memory device.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 5:
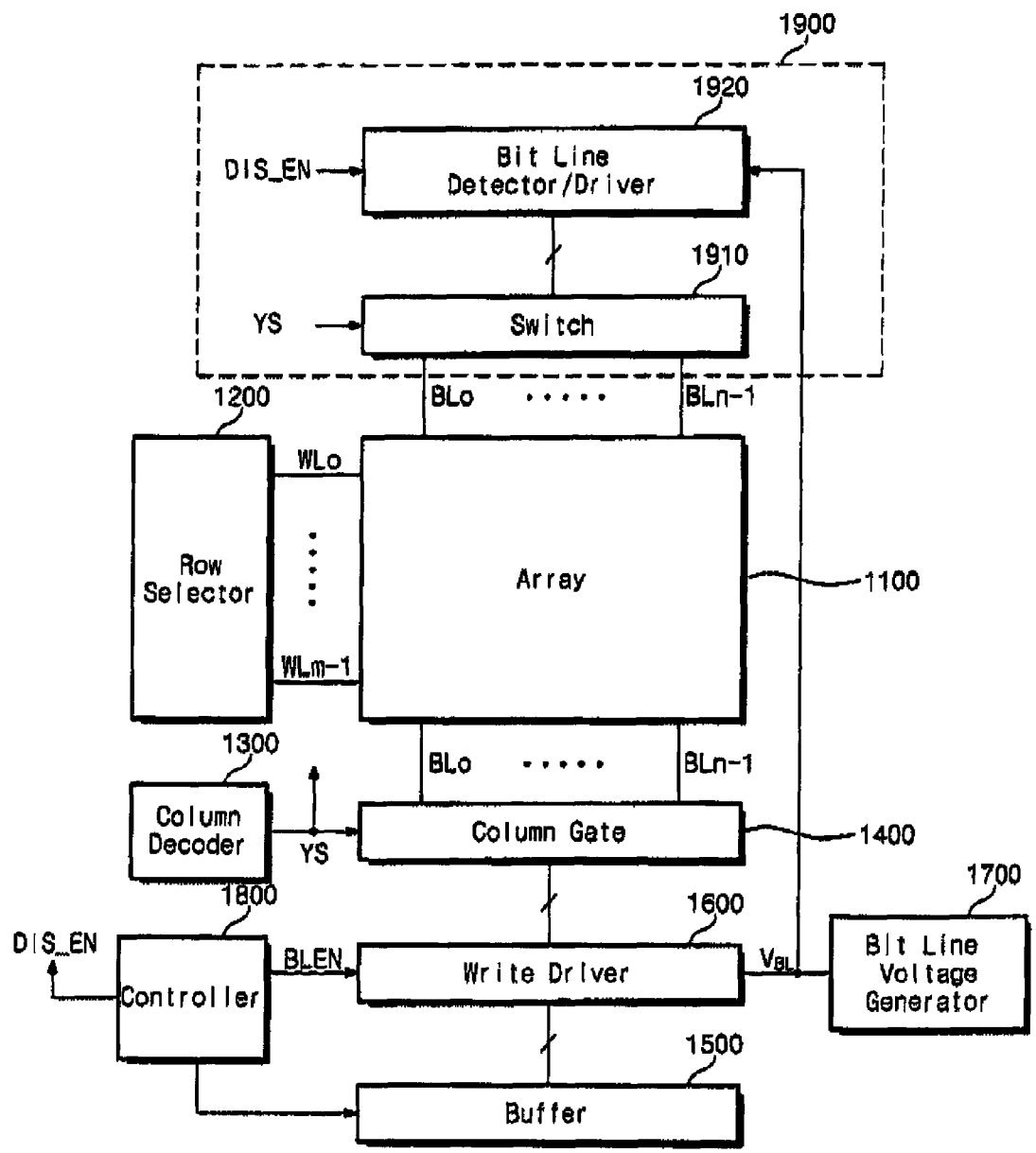
FIG. 5 is a block diagram illustrating a flash memory device, in accordance with an exemplary embodiment of the present invention.

FIG. 5 is a block diagram illustrating a flash memory device, according to an illustrative embodiment of the present invention.

Referring to FIG. 5, the flash memory device includes a memory cell array 1100, a row selector 1200, a column decoder 1300, a column gate circuit 1400, an input buffer circuit 1500, a write driver circuit 1600, a bit line voltage generator 1700, and a controller 1800.

The memory cell array 1100 includes memory cells arranged in a matrix of word lines WL0~WLm-1 and bit lines BL0~BLn-1. Each memory cell may be formed as shown in FIG. 1, for example. The row selector 1200 selects one of the word lines WL0~WLm-1 in response to a row address and activates the selected word line with a word-line voltage.

The column decoder 1300 generates column selection information YS based on decoding performed in response to a column address. The column gate circuit 1400 is connected to respective first ends or terminals of the bit lines BL0~BLn-1, partially selecting one or more of the bit lines BL0~BLn-1 in response to the column selection information YS. The selected bit lines are connected to the write driver circuit 1600. The column decoder 1300 and the column gate circuit 1400 constitute a column selection circuit to select at least a portion of the bit lines BL0~BLn-1 in response to the column address.

The input buffer circuit 1500 receives externally provided data in accordance with a control operation by the controller 1800. The write driver circuit 1600 (which has multiple write drivers corresponding to the bit lines BL0~BLn-1) operates in response to an enabling signal BLEN provided by the controller 1800. The write driver circuit 1600 activates the selected bit lines to a bit line voltage $V_{BL}$, which is supplied by the bit line voltage generator 1700, according to data stored in the input buffer circuit 1500. The bit line voltage generator 1700 may operate to generate the bit line voltage $V_{BL}$ in response to the controller 1800.

As shown in FIG. 5, the flash memory device according to the illustrative embodiment of the present invention further includes a bit line detecting/driving circuit 1900 connected to the respective second terminals of the bit lines BL0~BLn-1, which are opposite from the first terminals. The bit line detecting/driving circuit 1900 detects voltages from the bit lines selected by the column gate circuit 1400 and drives the selected bit lines to the bit line voltage $V_{BL}$, which is supplied by the bit line voltage generator 1700, in accordance with a result of the detection. The bit line detecting/driving circuit 1900 includes a switch circuit 1910 and a bit line detector/driver 1920.

The switch circuit 1910 selectively connects to the selected bit lines BL0~BLn-1 in response to the column selection information YS provided by the column decoder 1300. The column selection information YS is the same as that provided to the column gate circuit 1400. Accordingly, the bit lines selected by the switch circuit 1910 are identical to the bit lines selected by the column gate circuit 1300.

The bit line detector/driver 1920 operates in response to a control signal DIS_EN provided by the controller 1800, and detects voltages from the selected bit lines through the switch circuit 1910. The bit line detector/driver 1920 drives the bit lines, which are selected as a result of the detection, to the bit line voltage $V_{BL}$ from the second terminals of the selected bit lines, varying in accordance with the detected voltage. For instance, a voltage of a selected bit line driven by the write driver circuit 1600 increases with the program data and maintains 0V with the program-inhibition data. In the former case, the bit line detector/driver 1920 activates the bit line to the bit line voltage $V_{BL}$ in response to an increase of the voltage on the bit line. In other words, with the program data, the selected bit lines are simultaneously driven by the write driver circuit 1600 and the bit line detector/driver 1920 which are located at both ends of the selected bit lines. Therefore, voltage drop over the selected bit lines due to an increase of resistance on the bit lines is prevented, which enhances program performance of the flash memory device.

Figure 6:
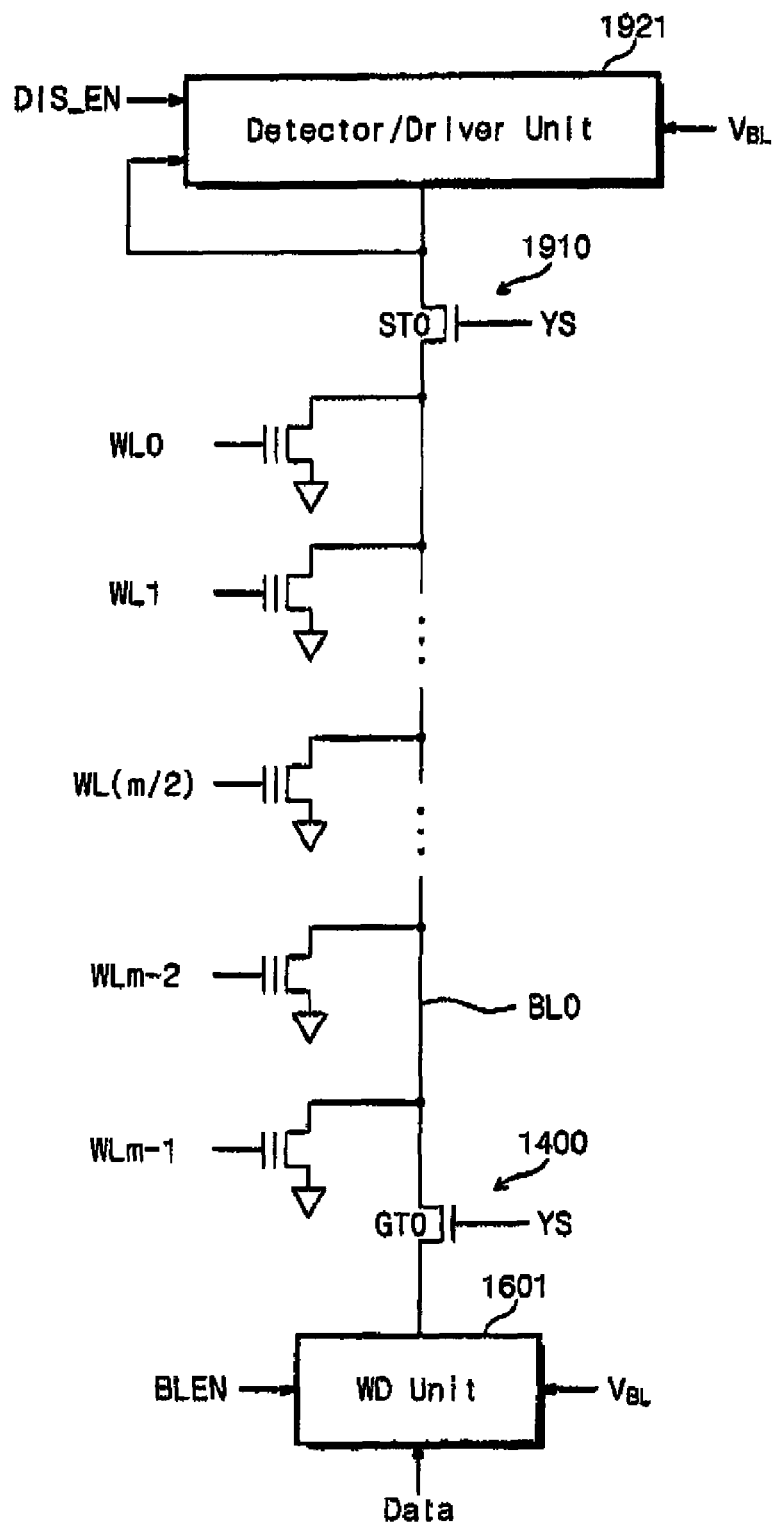
FIG. 6 is a block diagram illustrating a bit line detector/driver of FIG. 5, in accordance with an exemplary embodiment of the present invention.
Figure 7:
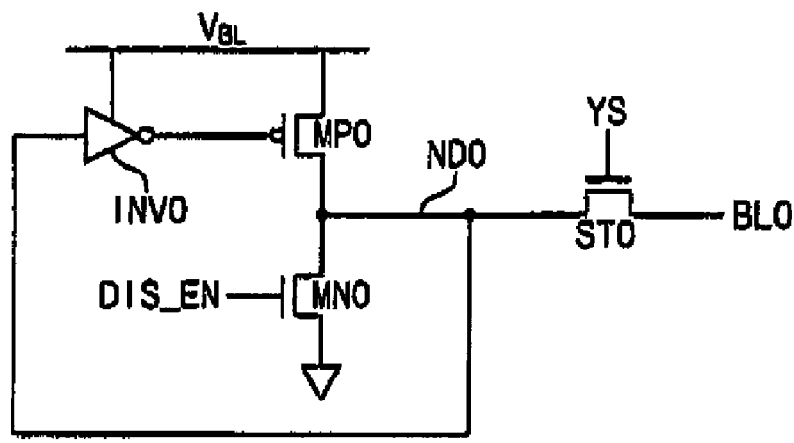
FIG. 7 is a circuit diagram illustrating a bit line detector/driver unit of FIG. 6, in accordance with an exemplary embodiment of the present invention.

FIG. 6 is a block diagram illustrating a bit line detector/driver unit 1921 of the bit line detector/driver 1920 shown in FIG. 5, according to an illustrative embodiment of the present invention. FIG. 7 is a circuit diagram illustrating the bit line detector/driver unit 1921 shown in FIG. 6, according to an illustrative embodiment of the present invention. For the convenience of description, FIG. 6 shows only one bit line detector/driver unit 1921 of the bit line detector/driver 1920 and one write driver unit 1601 of the write driver circuit 1600, which correspond to a single bit line (e.g., BL0). It is understood that the other bit lines (not shown in FIG. 6) may have corresponding detector/driver units and write driver units, as well.

As illustrated in FIG. 6, a first terminal (or end) of the bit line BL0 is connected to the write driver unit 1601 through a column gate transistor GT0. The other end of the bit line BL0 is connected to the bit line detector/driver unit 1921 through a switch transistor ST0 of the switch circuit 1910. The switch transistor ST0 and the column gate transistor GT0 are controlled by the same column selection signal YS. The write driver unit 1601 is configured to drive the bit line BL0 to the bit line voltage $V_{BL}$ during an active period of the enabling signal BLEN when the input data is program data. The write driver unit 1601 is also configured to drive the bit line BL0 to the ground voltage during an active period of the enabling signal BLEN when the input data is program-inhibition data.

The bit line detector/driver unit 1921 is configured to detect a voltage from the bit line BL0 when the control signal DIS_EN is inactivated to a low level, driving the bit line BL0 to the bit line voltage $V_{BL}$. An output terminal of the bit line detector/driver unit 1921 is held at the ground voltage when the control signal DIS_EN is activated.

The bit line detector/driver unit 1921, as illustrated in FIG. 7, includes a PMOS transistor MP0, an NMOS transistor MN0, and an inverter INV0. The PMOS transistor MP0 is connected between the bit line voltage $V_{BL}$ and an output terminal ND0, and is controlled by an output of the inverter INV0. The NMOS transistor MN0 is connected between the output terminal ND0 and the ground voltage, and is controlled by the control signal DIS_EN. An input node of the inverter INV0 is coupled to the output terminal ND0. An output node of the inverter INV0 is coupled to a gate of the PMOS transistor MP0.

In this embodiment, the inverter INV0 detects voltage variations from the output terminal ND0, forming a detector to control the PMOS transistor MP0 in response to the detected voltage variations. The bit line detector/driver unit 1921 may thus drive the selected bit line synchronously with the voltage variations.

Figure 8:
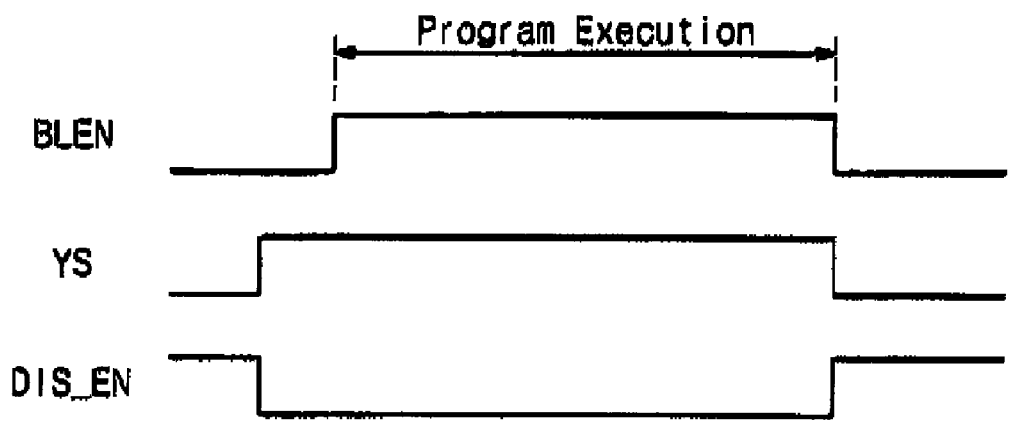
FIG. 8 is a timing diagram illustrating an operation of the bit line detector/driver unit of FIG. 7, in accordance with an exemplary embodiment of the present invention.

FIG. 8 is a timing diagram showing an operation of the bit line detector/driver unit 1921 shown in FIG. 7. An exemplary method of programming the bit line detector/driver unit 1921 will be described with reference to FIGS. 5-8, according to an embodiment of the present invention.

At the beginning of a programming operation, data is transferred to the input buffer circuit 1500 from outside the memory (e.g., from a memory controller or a host). Row and column addresses are provided to the row selector 1200 and the column decoder 1300. The row selector 1200 operates to select one of the word lines WL0~WLm−1 in response to the row address. The column decoder 1300 generates the column selection information YS in response to the column address. The column gate circuit 1400 selects a number of the bit lines BL0~BLn−1 in response to the column selection information YS. At the same time, the switch circuit 1910 of the bit line detecting/driving circuit 1900 connects the same bit lines that have been selected by the column gate circuit 1400 to the bit line detector/driver 1920. Accordingly, one end of each selected bit line is connected to the write driver circuit 1600 and the corresponding other end of each selected bit line is connected to the bit line detector/driver 1920. As shown in FIG. 8, the control signal DIS_EN is held at a low level during this time (e.g., when the column selection information YS is active), turning off the NMOS transistor MN0 of the bit line detector/driver 1920.

The controller 1800 activates the bit line enabling signal BLEN and the selected bit lines are driven to the bit line voltage $V_{BL}$ in response to the activation of the enabling signal BLEN. As previously discussed, when the data transferred to the input buffer circuit 1500 is program data, the write driver circuit 1600 drives the selected bit lines to the bit line voltage $V_{BL}$ as a bit line program voltage. Otherwise, when the data transferred to the input buffer circuit 1500 is program-inhibition data, the write driver circuit 1600 drives the selected bit lines to the ground voltage as the bit line program voltage. The memory cells are programmed under the bias condition of the bit lines.

The method is further described with respect to a single selected bit line for convenience of explanation (e.g., as shown in FIG. 6). As the selected bit line is driven to the bit line voltage $V_{BL}$ by the write driver unit 1601, a voltage of the selected bit line gradually increases. The increase of voltage on the selected bit line is detected by the bit line detector/driver unit 1921. More particularly, the inverter INV0 of the bit line detector/driver unit 1921 detects whether the voltage of the selected bit line reaches a predetermined detection voltage. The PMOS transistor MP0 transfers the bit line voltage $V_{BL}$ to the selected bit line in accordance with a result of the detection. A voltage detected by the inverter INV0 may be set at various levels. As the selected bit line is driven from both ends, i.e., by the write driver unit 1601 and the bit line detector/driver unit 1921, a drop of the bit line voltage $V_{BL}$ due to resistance of the bit line is minimized.

After the programming operation progresses for a predetermined time under the bias condition, the column selection information YS is inactivated. This means that the electrical connections between the selected bit lines and each of the bit line detecting/driving circuit 1900 and the write driver circuit 1600 are interrupted. In addition, as shown in FIG. 8, the controller 1800 inactivates the enabling signal BLEN (e.g., to a low level) and activates the control signal DIS_EN (e.g., to a high level). In response to the high level of the control signal DIS_EN, the NMOS transistor MN0 of the bit line detector/driver unit 1921 is turned on, which turns the PMOS transistor MP0 off. Accordingly, the output terminal ND0 of the bit line detector/driver unit 1921 is set to the ground voltage.

Figure 9:
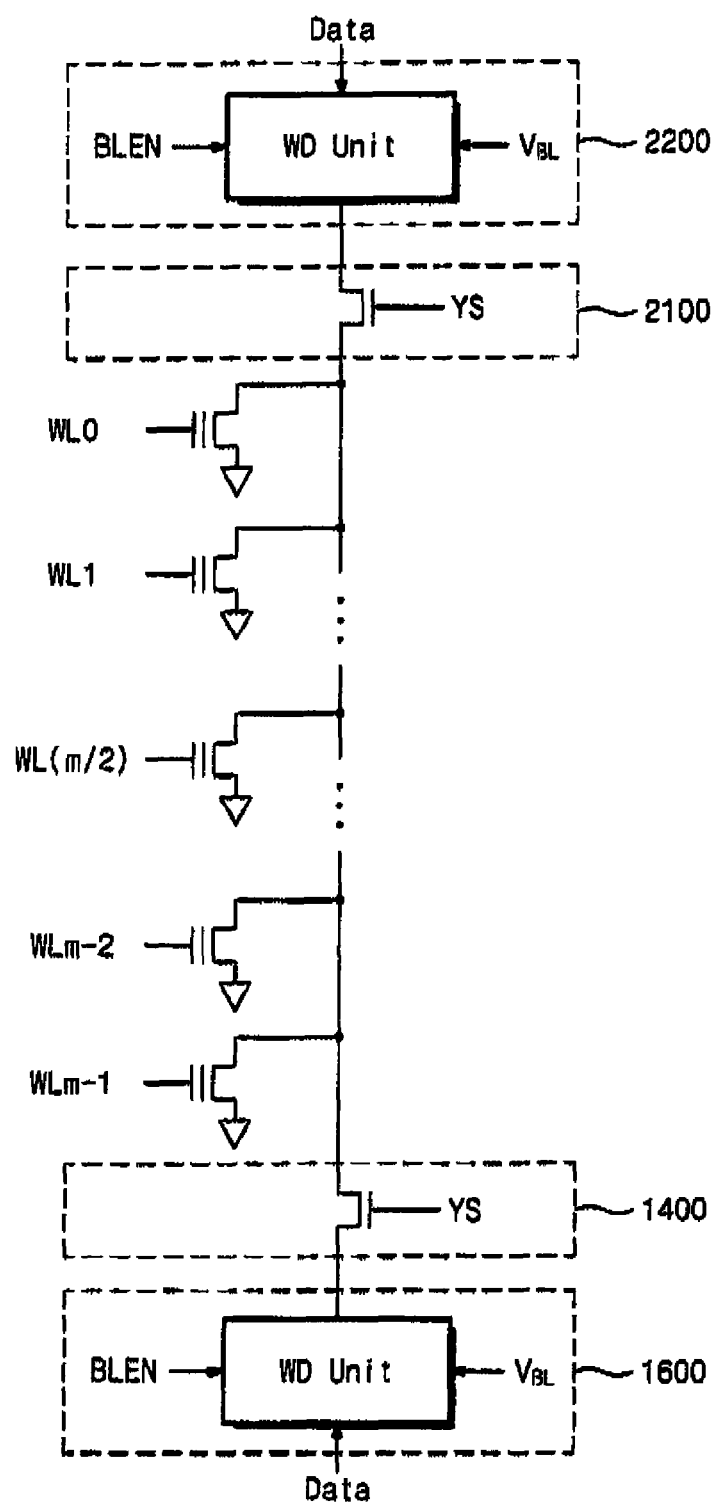
FIG. 9 is a block diagram illustrating a flash memory device, in accordance with another exemplary embodiment of the present invention.

FIG. 9 is a block diagram illustrating a flash memory device in accordance with another illustrative embodiment of the present invention.

The flash memory device shown in FIG. 9 is substantially the same as the flash memory device shown in FIG. 6, except that the bit line detecting/driving circuit 1900 (including the switch circuit 1910 and the bit line detector/driver 1920) is replaced by a second column gate circuit 2100 and a second write driver circuit 2200. In FIG. 9, the elements that are substantially the same in function as the elements of FIG. 5 are indicated by the same reference numbers, and thus the description of these elements will not be repeated. The second column gate circuit 2100 and the second write driver circuit 2200 are substantially same as the column gate circuit 1400 and the write driver circuit 1600, respectively, described above with respect to FIG. 5. In contrast to the bit line detecting/driving circuit 1900, the write driver circuit 2200 operates to drive the bit line in accordance with input data. In this configuration, the flash memory device of FIG. 9 may have the same effect as described above with respect to FIG. 5.

As described above, the flash memory device according to the present invention improves program performance, for example, by preventing a voltage drop of the bit line due to an increase of bit line resistance.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device comprising:
    a memory cell array comprising a plurality of memory cells arranged in a matrix comprising a plurality of word lines and a plurality of bit lines;
    a column decoder configured to select at least one bit line of the plurality of bit lines in response to a column address;
    a write driver circuit configured to drive the at least one selected bit line to a bit line voltage in accordance with input data in response to an enable signal; and
    a bit line detecting/driving circuit configured to drive the at least one selected bit line to the bit line voltage, while the write driver circuit continues to drive the at least one selected bit line, when the bit line detecting/driving circuit detects variations of the at least one selected bit line from the bit line voltage, in response to a decoding result of the column address during a programming operation,
    wherein the bit line detecting/driving circuit comprises:
        a switch circuit for connecting the at least one bit line of the plurality of bit lines in response to the decoding result of the column address; and
        a plurality of bit line detector/driver units, at least one bit line detector/driver unit being connected to the at least one selected bit line through the switch circuit, the bit line detecting/driving unit detecting voltages from the at least one bit line and driving the at least one selected bit line to the bit line voltage in accordance with the detected voltages, and
    wherein each of the bit line detecting/driving units comprises:
        a PMOS transistor connected between the bit line voltage and an output terminal;
        an NMOS transistor connected between the output terminal and a ground voltage, the NMOS transistor being controlled by a control signal from a controller; and
        a detector configured to detect voltage variation of the output terminal and to control the PMOS transistor in response to the voltage variation detection.

2. The flash memory device as set forth in claim 1, wherein the detector comprises an inverter.

3. The flash memory device as set forth in claim 1, wherein the control signal is complementary to the decoding result of the column address.

4. The flash memory device as set forth in claim 3, wherein the decoding result of the column address is activated before activation of the enable signal.

* * * * *